United States Patent
Kumar et al.

(10) Patent No.: US 9,064,066 B2
(45) Date of Patent: Jun. 23, 2015

(54) METHODS AND SYSTEMS FOR WELL PLANNING BASED ON A COMPLEX FRACTURE MODEL

(75) Inventors: Amit Kumar, Houston, TX (US); Ronald G. Dusterhoft, Katy, TX (US); Richard D. Colvin, Dripping Springs, TX (US); Kenneth E. Williams, Houston, TX (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 0 days.

(21) Appl. No.: 13/883,783

(22) PCT Filed: Oct. 28, 2011

(86) PCT No.: PCT/US2011/058410
§ 371 (c)(1), (2), (4) Date: May 7, 2013

(87) PCT Pub. No.: WO2013/062591
PCT Pub. Date: May 2, 2013

(65) Prior Publication Data
US 2013/0231910 A1    Sep. 5, 2013

(51) Int. Cl.
*G06F 17/50* (2006.01)
*G06F 19/00* (2011.01)
*E21B 43/26* (2006.01)
*E21B 43/30* (2006.01)
*E21B 47/022* (2012.01)

(52) U.S. Cl.
CPC ............ *G06F 17/5009* (2013.01); *G06F 19/00* (2013.01); *E21B 43/26* (2013.01); *E21B 43/305* (2013.01); *E21B 47/022* (2013.01)

(58) Field of Classification Search
CPC ... E21B 47/00; E21B 43/305; G06F 17/5009; G06F 19/00
USPC .......... 702/6, 12, 13, 14, 16, 17; 703/1, 2, 10; 367/73
See application file for complete search history.

(56) References Cited

U.S. PATENT DOCUMENTS

| | | | |
|---|---|---|---|
| 6,829,570 B1 | 12/2004 | Thambynayagam et al. | |
| 8,447,524 B2 * | 5/2013 | Chen et al. | 702/16 |
| 2007/0271039 A1 * | 11/2007 | Ella et al. | 702/12 |
| 2008/0068928 A1 | 3/2008 | Duncan et al. | |
| 2008/0091396 A1 | 4/2008 | Kennon et al. | |
| 2008/0130407 A1 | 6/2008 | Akhtar | |
| 2009/0248312 A1 | 10/2009 | Hsu et al. | |
| 2010/0138196 A1 * | 6/2010 | Hui et al. | 703/1 |

(Continued)

OTHER PUBLICATIONS

International Search Report and Written Opinion issued May 23, 2012 in International Patent Application PCT/US2011/058410, filed Oct. 28, 2011.

(Continued)

*Primary Examiner* — Daniel L Murphy

(57) ABSTRACT

Optimizing well planning scenarios. At least some of the illustrating embodiments include: receiving, by a computer system, a complex fracture model that estimates fractures in a subsurface target; applying the complex fracture model to a reservoir model that estimates geological features between the subsurface target and earth's surface; and determining an earth surface well site and a well path from the earth surface well site to the subsurface target based on the complex fracture model and the geological information, wherein the earth surface well site is offset from the subsurface target.

20 Claims, 5 Drawing Sheets

(56) References Cited

U.S. PATENT DOCUMENTS

2011/0257944 A1* 10/2011 Du et al. .......................... 703/2
2011/0264429 A1   10/2011 Lee et al.

OTHER PUBLICATIONS

European Search Report, Feb. 2, 2015, pp. 1-7, European Patent Office.

* cited by examiner

METHODS AND SYSTEMS FOR WELL PLANNING BASED ON A COMPLEX FRACTURE MODEL

BACKGROUND

Advances in directional drilling (i.e., horizontal drilling) along with advances in hydraulic fracturing have made economical the production of oil and gas from shale formations. For future planning purposes, companies involved in oil and gas production need estimates of future production from such shale formations. In an attempt to provide such estimates of future production, the oil and gas industry has attempted use formation modeling tools originally designed for conventional reservoirs (with high permeability). However, shale formations are vastly different than conventional reservoirs. For example, some shale formations may have 500 times less porosity than conventional reservoirs.

So far the industry has been focused on well-level planning and the so-called "factory model" is adopted for field-wide well planning, i.e. cookie-cutter wells are drilled after performing a pilot study to select the preferred well plan for the entire field. However, heterogeneities that exist in shale fields indicate that one particular well plan is likely not optimal for the entire field.

Any advance which makes modeling of future hydrocarbon production from shale formations more accurate would provide a competitive advantage.

BRIEF DESCRIPTION OF THE DRAWINGS

For a detailed description of exemplary embodiments, reference will now be made to the accompanying drawings in which.

NOTATION AND NOMENCLATURE

Figure 1:
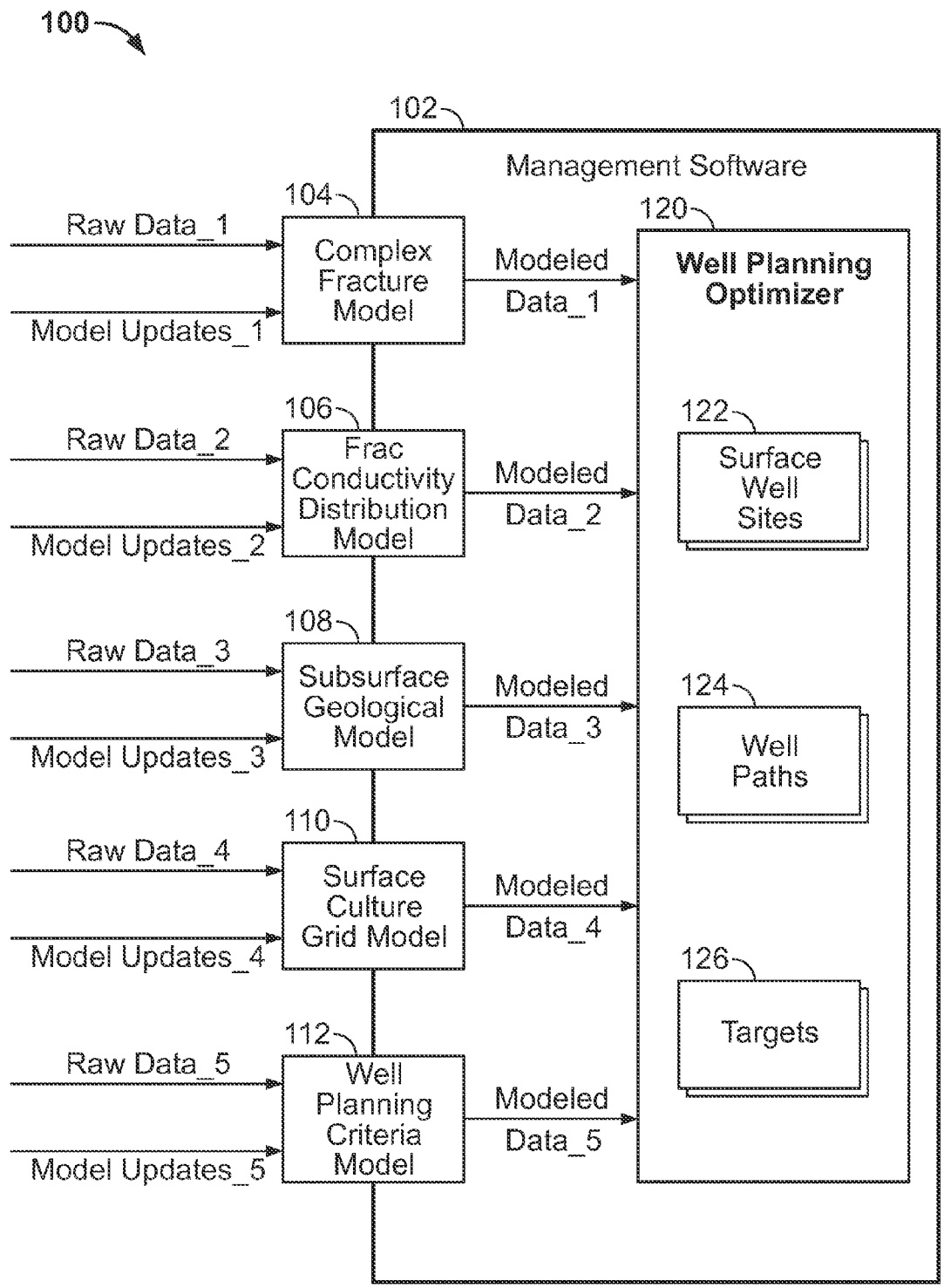
FIG. 1 graphically shows an illustrative set of programs used to make decisions in accordance with at least some embodiments.

Certain terms are used throughout the following description and claims to refer to particular components. As one skilled in the art will appreciate, different companies may refer to a component by different names. This document does not intend to distinguish between components that differ in name but not function.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

The terms "program" and "software" are used throughout the specification and claims. Each of the terms "program" and "software" refer to executable computer code, groups of executable computer code, or computer code that can become or be used to create execute computer code. Particular components referred to as "programs" in this specification could equivalently be referred to as "software". Likewise, particular components referred to as "software" in this specification could equivalently be referred to as "programs". The terminology is adopted merely to help the reader distinguish different computer codes (or groups of computer code).

The term "microseismic data" is intended to mean data that is captured from the occurrence of subsurface events (e.g., fracing) during which fractures are manifested. The term "complex fracture" is intended to mean one or more sets of intersecting fracture planes. The term "complex fracture model" is intended to mean a set of rules that estimates attributes of complex fractures from subsurface data such as microseismic data. The term "surface culture grid" is intended to mean natural and manmade features on earth's surface.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The various embodiments are directed to software tools which assist an engineer in making decisions regarding well planning for a particular underground formation or portion of an underground formation. More particularly, the various embodiments are directed to methods, systems, and computer-readable media that determine the location of earth surface well sites and corresponding well paths to at least one subsurface targets based on various inputs including: a complex fracture model that estimates fractures in the subsurface target, a reservoir model that estimates geological features between the subsurface target and the earth's surface, and a culture grid model that estimates natural and manmade features that would interfere with earth surface well sites.

With the disclosed well planning technique, a well planning process is facilitated by consideration of the complex fracture system and the geology that is present in the subsurface region of unconventional target fields (resource plays). The combined analysis of the surface and subsurface knowledge and limitations will allow for more efficient and economic development of the resources of a target field.

The characteristics of complex fracture estimates are derived from data, such as microseismic data, near existing wells and subsequently estimated near one or more offset wells and even through the larger area of the target field. The subsurface geology of the target field and its vertical and lateral variations are considered to determine where wells are to be drilled. The surface conditions and limitations on the location of the well (e.g., lease boundaries, streams, lakes, roads and barns or houses, etc.) and the design parameters of the wellbore (e.g., deviation of the wellbore, casing placement and size, kick-off point, build angle, lateral length, drilling of multi-laterals or multiple wells from the same surface location, etc.) are considered in the disclosed well planning technique.

Applying a complex fracture model to at least one offset well as described herein improves well spacing and trajectory. Complex fracture models or simplified versions thereof can be applied to one well or to a full field. Further, a reservoir model with well plans conditioned to complex fracture estimates facilitates flow simulation. Stochastic flow simulation based on equiprobable complex fracture realizations to evaluate uncertainty of outcome from flow simulation can also be implemented. In at least some embodiments, the disclosed well planning technique optimizes the orientation, the spacing, and the vertical position of well paths in a target formation based upon a complex fracture model.

In some embodiments, the disclosed technique takes microseismic data available for a well to determine a preferred wellbore orientation and applies that wellbore orientation to the rest of the field or to the area of interest. The assumption is that the stress regime in the entire area of interest is stationary. If the area of interest has more than one well with microseismic data, the additional data can be utilized as well.

Two types of spacing decisions are important for well planning. These are the spacing between wells and the spacing between fracture stages in a single well. Both are optimized by the disclosed well planning technique. The well spacing is selected, for example, by correlating stimulated reservoir volume (SRV) for the well with microseismic data. Further, the fracture spacing may be selected based on the SRV for different fracture stages of the well being correlated with microseismic data. The disclosed technique also conditions fracture spacing to fracture conductivity values output by a propagation model for complex fracture modeling.

The depth of a lateral is based on geological attributes, such as stratigraphy. In some embodiments, a program such as ShaleLOG data provides an estimate of brittleness or fracability of the formation, which may be calculated for the geologic framework. Although 3D seismic data is primarily used for hazard avoidance, attributes such as brittleness can be considered to identify sweet spots as part of the disclosed well planning technique.

FIG. 1 graphically shows an illustrative set of programs used to make decisions regarding well planning in accordance with at least some embodiments. More specifically, FIG. 1 shows management software 102 that includes a well planning optimizer program 120. In operation, the well planning optimizer program 120 is able to organize one or multiple plans for earth surface well sites 122 and well paths 124 in relation to one or more subsurface targets 126. Existing plans may be stored and updated (creating modified plans or new plans) by the well planning optimizer program 120 as more information becomes available regarding a target field being explored.

The input data to the well planning optimizer 120 may be received from various sources including: a complex fracture model program 104, a frac conductivity distribution model program 106, a subsurface geological model program 108, a surface culture grid model program 110, and a well planning criteria model program 112. More specifically, the complex fracture model program 104 is shown to receive raw data_1 and to provide modeled data_1 to the well planning optimizer 120. Over time, model updates_1 may be provided to the complex fracture model program 104 to adjust its modeling operations if improved modeling becomes available. Further, the frac conductivity distribution model program 106 is shown to receive raw data_2 and to provide modeled data_2 to the well planning optimizer program 120. Over time, model updates_2 may be provided to the frac conductivity distribution model program 106 to adjust its modeling operations as improved modeling becomes available. Further, the subsurface geological model program 108 is shown to receive raw data_3 and to provide modeled data_3 to the well planning optimizer program 120. Over time, model updates_3 may be provided to the subsurface geological model program 108 to adjust its modeling operations as improved modeling becomes available. Further, the surface culture grid model program 110 is shown to receive raw data_4 and to provide modeled data_4 to the well planning optimizer program 120. Over time, model updates_4 may be provided to the surface culture grid model program 110 to adjust its modeling operations as improved modeling becomes available. Further, the well planning criteria model program 112 is shown to receive raw data_5 and to provide modeled data_5 to the well planning optimizer program 120. Over time, model updates_5 may be provided to the well planning criteria model program 112 to adjust its modeling operations as improved modeling becomes available.

In accordance with at least some embodiments, the raw data_1 that is input to the complex fracture model program 104 comprises microseismic data gathered from microseismic operations in a subsurface region of interest. For example, microseismic operations (e.g., hydraulic fracing operations) may be performed along a well that has already been drilled in a target field. Although some natural subsurface fractures may already exist, the microseismic operations enables detection of natural and frac-based complex fractures that are exhibited in the target field. The modeled data_1 provided from the complex fracture model program 104 to the well planning optimizer program 120 includes data such as the orientation (strike), dip and spacing of subsurface complex fractures. The modeled data_1 also may include statistics, descriptive text, and/or images to represent complex fractures. In some embodiments, a simplified complex fracture model or image is received by the well planning optimizer program 120. The modeled data_1 may organize the complex fractures into groups (families) that can be applied to other areas of a target field based on the assumption that similar complex fracturing groups are applicable to other areas of the target field.

In accordance with at least some embodiments, the raw data_2 that is input to the frac conductivity distribution model program 106 comprises current stress data for a subsurface region of interest (e.g., in the target field). The modeled data_2 provided from the frac conductivity distribution model program 106 to the well planning optimizer program 120 includes statistics, descriptive text, and/or images related to propagation estimation for frac conductivity based on the current stress data.

In accordance with at least some embodiments, the raw data_3 that is input to the subsurface geological model program 108 comprises stratigraphy depth data, burial history data and/or rock characteristics data for a subsurface region of interest (e.g., in the target field). The modeled data_3 provided from the subsurface geological model program 108 to the well planning optimizer program 120 includes statistics, descriptive text, and/or images to represent geological features in the region of interest. The modeled data_3 may organize the geological features so that grouped features can be applied to other areas of a target field based on the assumption that similar geological features are applicable to other areas of the target field.

In accordance with at least some embodiments, the raw data_4 that is input to the surface culture grid model program 110 comprises property lines and acreage, topography, and/or manmade structures. The modeled data_4 provided from the surface culture grid model program 110 to the well planning optimizer program 120 includes statistics, descriptive text, and/or images to represent earth surface features in the region of interest.

In accordance with at least some embodiments, the raw data_5 that is input to the well planning criteria model program 112 comprises completion methods, frac characteristics, well deviation information, and/or cost considerations. The modeled data_5 provided from the well planning criteria model program 112 to the well planning optimizer program 120 includes statistics, descriptive text, and/or images to represent well planning criteria features in the region of interest.

In at least some embodiments, the management software 102 corresponds to a piece of software that integrates the well planning optimizer program 120 with the complex fracture model program 104, the frac conductivity distribution model program 106, the subsurface geological model program 108, the surface culture grid model program 110, and the well planning criteria model program 112 into one software package executed by a single computing entity. Alternatively, the management software 102 corresponds to a piece of software that executes the well planning optimizer program 120, but that is separate from at least one of the complex fracture model program 104, the frac conductivity distribution model program 106, the subsurface geological model program 108, the surface culture grid model program 110, and the well planning criteria model program 112. In such case, the management software 102 is still able to receive the modeled data_1, the modeled data_2, the modeled data_3, the modeled data_4, and the modeled data_5 by communicating with corresponding programs that are executed separately (on the same computer or on different computers that are in communication with each other).

Figure 2A:
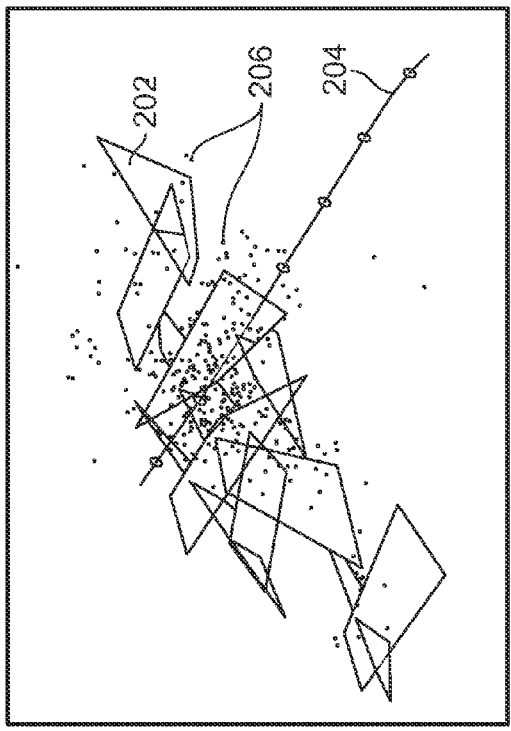
FIGS. 2A and 2B show screenshots of a program that performs complex fracture modeling in accordance with at least some embodiments.
Figure 2B:
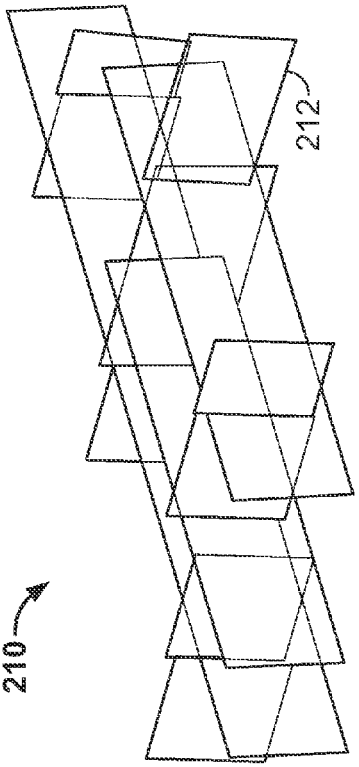

FIGS. 2A and 2B show screenshots 200A and 200B of a program that performs complex fracture modeling (e.g., the complex fracture model program 104) in accordance with at least some embodiments. In screenshot 200A, various complex fracture planes 202 are determined to exist based on microseismic events (represented as small dots) 206. The fracture planes 202 may vary with regard to orientation, dip and spacing. Often different fracture planes 202 run approximately in parallel while others are approximately perpendicular to each other as shown. In screenshot 200A, a well path 204 is also shown, where the orientation of the well path 204 intentionally intersects at least one of the complex fracture planes 202. In FIG. 2B, the screenshot 200B shows the fracture planes 202, the well path 204, and the microseismic events 206 at a different angle. In other words, the complex fracture model program 104 or other program enables a user to study complex fracture families from different angles.

Figure 2C:
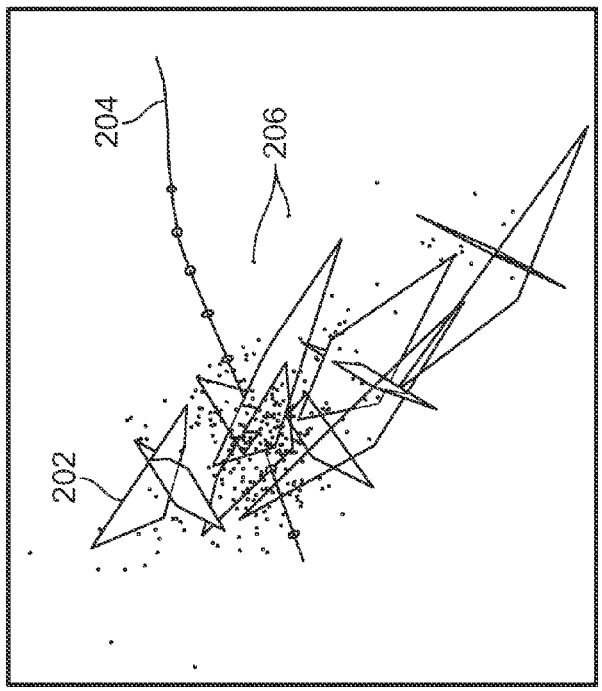
FIG. 2C shows a simplified complex fracture model in accordance with at least some embodiments.

FIG. 2C shows a simplified complex fracture model 210 in accordance with at least some embodiments. The simplified complex fracture model 210 may be created, for example, using statistical tools to determine a statistically equivalent complex fracture model that can be easily incorporated into a well plan. In at least some embodiments, simplified complex fracture models such as model 210 may be included with the modeled data_1 that is output from the complex fracture model program 104 to the well planning optimizer program 120.

Figure 3:
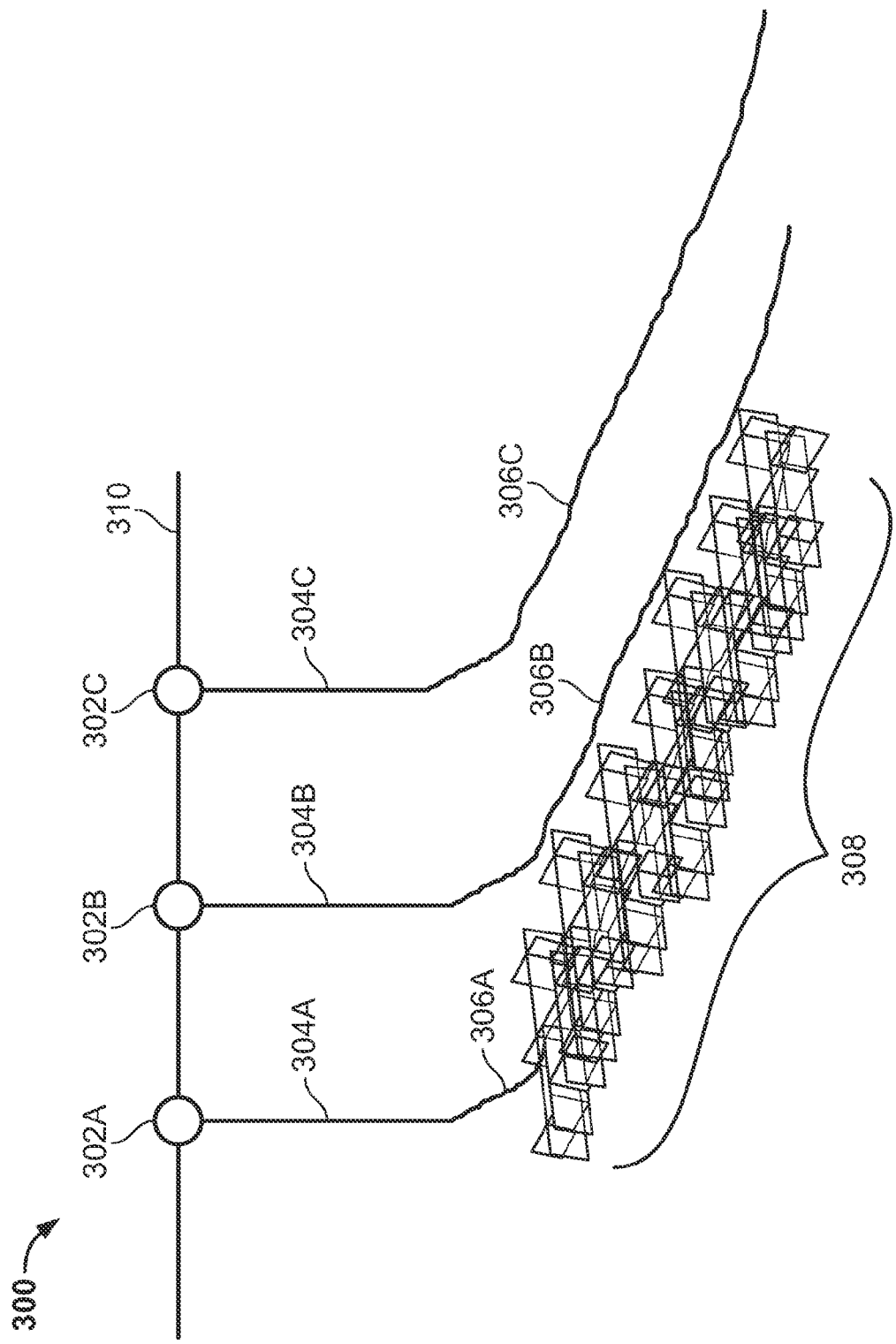
FIG. 3 shows application of the simplified complex fracture model of FIG. 2C into a field plan in accordance with at least some embodiments.

FIG. 3 shows application of the simplified complex fracture model 210 of FIG. 2C into a field plan 300 in accordance with at least some embodiments. The field plan 300 may be viewed and adjusted, for example, as a function of the well planning optimizer program 120. In the field plan 300, several copies 308 of the simplified complex fracture model 210 are applied to field plan 300. As shown, the field plan 300 includes earth surface well sites 302A-302C along earth's surface 310, as well as vertical well sections 304A-304B and horizontal well sections 306A-306C. The copies 308 of the simplified complex fracture model 210 are applied to the horizontal well section 306A in field plan 300. Additionally or alternatively, the copies 308 of the simplified complex fracture model 210 could be applied to the horizontal well sections 306B and/or 306C. The application of the copies 308 to the horizontal well section 306A results in the horizontal well section 306A intersecting some fracture planes of the copies 308 in an approximately perpendicular manner, while other fracture planes of the copies 308 run approximately parallel to the horizontal well section 306A. After applying the copies 308 of the simplified complex fracture model 210 to the field plan 300, a user is able to view, study, and adjust features of the field plan 300 as desired. For example, a user of the well planning optimizer program 120 may select or update a location of the earth surface well sites 302A-302C, the vertical well sections 304A-304C, the horizontal well sections 306A-306C, and the application of the copies 308 of the simplified complex fracture model 210 to the field plan 300.

Figure 4:
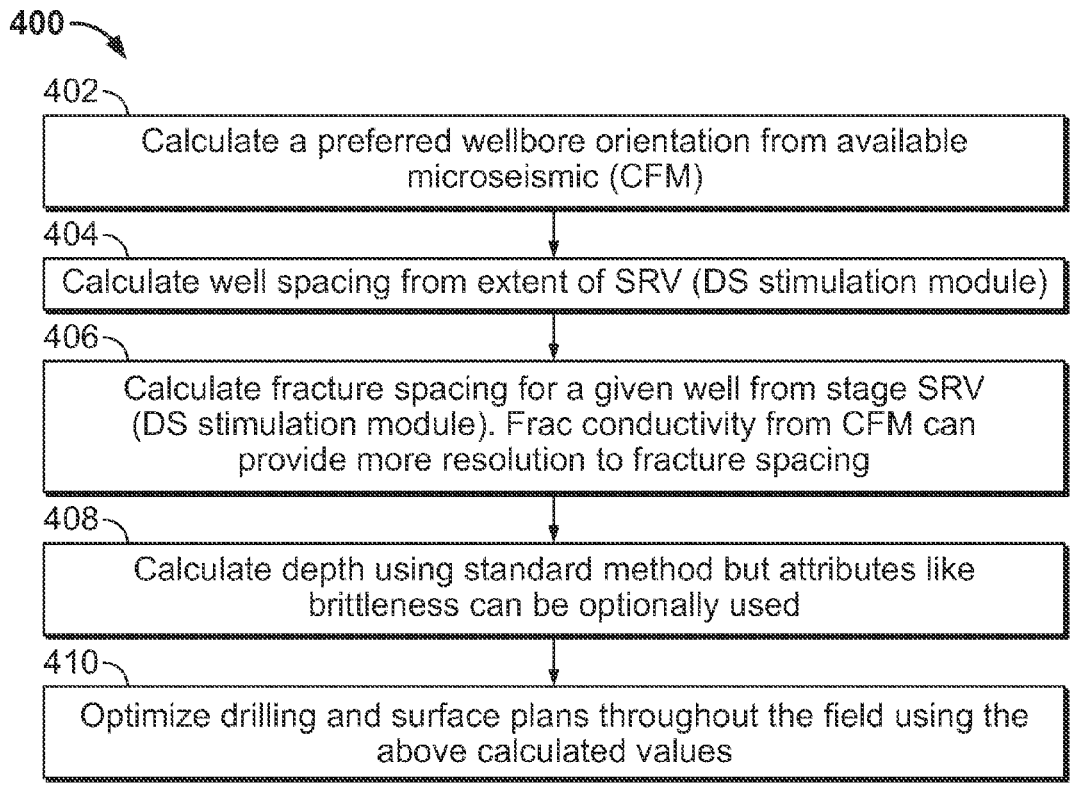
FIG. 4 shows a method in accordance with at least some embodiments.

FIG. 4 shows a method 400 in accordance with at least some embodiments. The method 400 may be performed, for example, by the management software 102 described for FIG. 1 or components in communication with the management software 102. As shown, the method 400 comprises calculating a preferred wellbore orientation from available microseismic data (block 402). For example, the preferred wellbore orientation may be calculated so as to intersect fracture planes that are indicated by microseismic data. At block 404, well spacing is calculated, for example, from the extent of stimulated reservoir volume (SRV) (e.g., the SRV may be provided by a DecisionSpace (DS) Stimulation module). At block 406, fracture spacing is calculated for a given well from stage SRV (again, the DS Stimulation module may be used). If needed, frac conductivity determined based on complex fracture modeling can provide higher resolution to fracture spacing. Depth may also be calculated and attributes like brittleness can be optionally used at block 408. Finally, drilling and surface plans are optimized throughout the target field using the previously calculated values (block 410).

Figure 5:
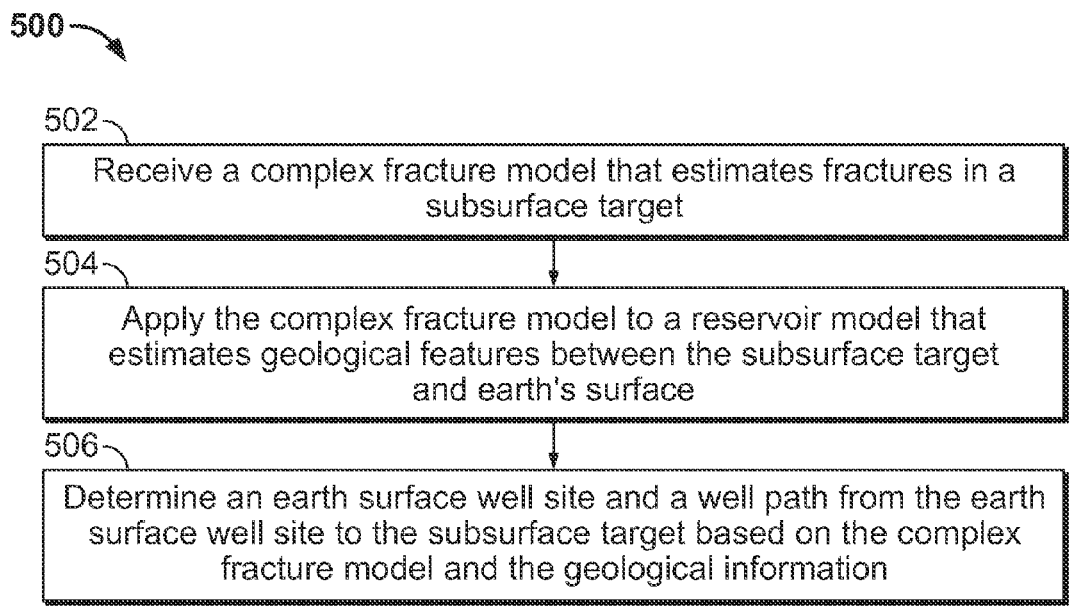
FIG. 5 shows another method in accordance with at least some embodiments.

FIG. 5 shows another method 500 in accordance with at least some embodiments. The method 500 may be performed, for example, by the management software 102 described for FIG. 1. As shown, the method 500 comprises receiving a complex fracture model that estimates fractures in a subsurface target (block 502). For example, the complex fracture model may estimate orientation, dip, and spacing of fractures in the subsurface target. These attributes may be determined based on microseismic data. At block 504, the complex fracture model is applied to a reservoir model that estimates geological features between the subsurface target and earth's surface. Finally, a location for an earth surface well site and a well path from the earth surface well site to the subsurface target are determined based on the complex fracture model and the geological information (block 506). In some embodiments, determining the location for a surface well site that is offset from a subsurface target may comprise determining a location of interfering features of a surface culture grid and avoiding said interfering features.

In some embodiments, the method 500 may also comprise additional or alternative steps. For example, the method 500 may comprise determining a fracture conductivity distribution based on stress and fracability estimates. Further, the method 500 may comprise performing a stochastic flow simulation based on the fractures estimated by the complex fracture model. The fracture conductivity distribution and stochastic flow simulation may be considered in the well planning. Further, the method 500 may comprise determining a spacing between a plurality of earth surface well sites offset from the subsurface target based on the complex fracture model and the geological information. Further, the method 500 may comprise determining a spacing between fracture stages of a well path based on the complex fracture model and the geological information.

Figure 6:
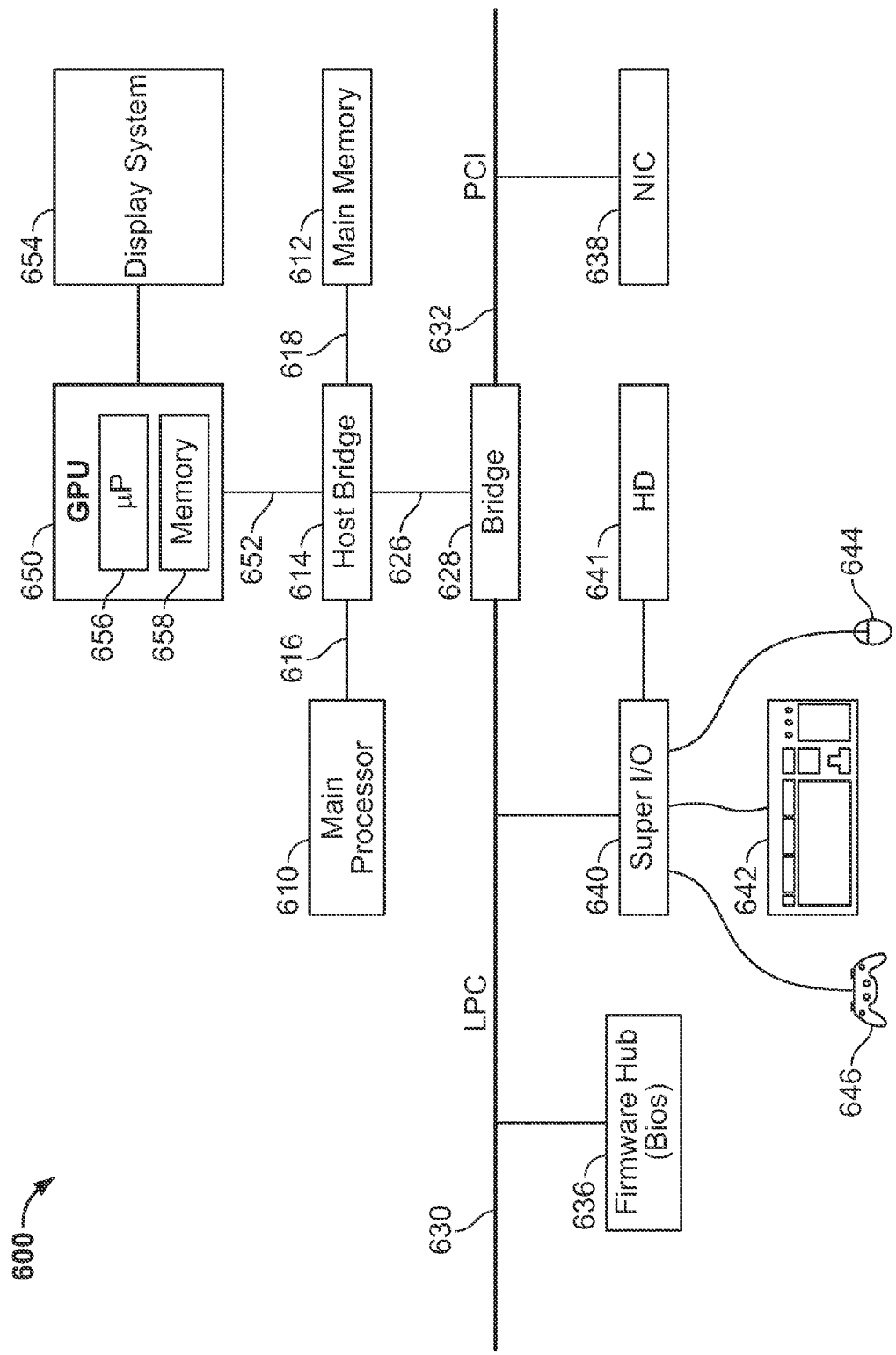
FIG. 6 shows a computer system in accordance with at least some embodiments.

FIG. 6 illustrates a computer system 600 in accordance with at least some embodiments, and upon which at least some of the various embodiments may be implemented. That is, some or all of the various embodiments may execute on a computer system such as shown in FIG. 6, multiple computers systems such as shown in FIG. 6, and/or one or more computer systems equivalent to the FIG. 6, including after-developed computer systems.

In particular, computer system 600 comprises a main processor 610 coupled to a main memory array 612, and various other peripheral computer system components, through integrated host bridge 614. The main processor 610 may be a single processor core device, or a processor implementing multiple processor cores. Furthermore, computer system 600 may implement multiple main processors 610. The main processor 610 couples to the host bridge 614 by way of a host bus 616 or the host bridge 614 may be integrated into the main processor 610. Thus, the computer system 600 may implement other bus configurations or bus-bridges in addition to, or in place of, those shown in FIG. 6.

The main memory 612 couples to the host bridge 614 through a memory bus 618. Thus, the host bridge 614 comprises a memory control unit that controls transactions to the main memory 612 by asserting control signals for memory accesses. In other embodiments, the main processor 610 directly implements a memory control unit, and the main memory 612 may couple directly to the main processor 610. The main memory 612 functions as the working memory for the main processor 610 and comprises a memory device or array of memory devices in which programs, instructions and data are stored. The main memory 612 may comprise any suitable type of memory such as dynamic random access memory (DRAM) or any of the various types of DRAM devices such as synchronous DRAM (SDRAM) (including double data rate (DDR) SDRAM, double-data-rate two (DDR2) SDRAM, double-data-rate three (DDR3) SDRAM), extended data output DRAM (EDODRAM), or Rambus DRAM (RDRAM). The main memory 612 is an example of a non-transitory computer-readable medium storing programs and instructions, and other examples are disk drives and flash memory devices.

The illustrative computer system 600 also comprises a second bridge 628 that bridges the primary expansion bus 626 to various secondary expansion buses, such as a low pin count (LPC) bus 630 and peripheral components interconnect (PCI) bus 632. Various other secondary expansion buses may be supported by the bridge device 628. In accordance with some embodiments, the bridge device 628 comprises an Input/Output Controller Hub (ICH) manufactured by Intel Corporation, and thus the primary expansion bus 626 comprises a Hub-link bus, which is a proprietary bus of the Intel Corporation. However, computer system 600 is not limited to any particular chip set manufacturer, and thus bridge devices and expansion bus protocols from other manufacturers may be equivalently used.

Firmware hub 636 couples to the bridge device 628 by way of the LPC bus 630. The firmware hub 636 comprises read-only memory (ROM) which contains software programs executable by the main processor 610. The software programs comprise programs executed during and just after POST.

The computer system 600 further comprises a network interface card (NIC) 638 illustratively coupled to the PCI bus 632. The NIC 638 acts as to couple the computer system 600 to a communication network, such the Internet.

Still referring to FIG. 6, computer system 600 may further comprise a super input/output (I/O) controller 640 coupled to the bridge 628 by way of the LPC bus 630. The Super I/O controller 640 controls many computer system functions, for example interfacing with various input and output devices such as a keyboard 642, a pointing device 644 (e.g., mouse), game controller 646, various serial ports, floppy drives and hard disk drives (HD) 641. The hard disk drive 641 is another example of a computer-readable media. In other cases, the hard disk drive 641 may couple to a separate drive controller coupled to a more powerful expansion bus, such as the PCI bus 632, particularly in cases where the hard disk drive is implemented as an array of drives (e.g., redundant array of independent (or inexpensive) disks (RAID)). In cases where the computer system 600 is a server computer system, the keyboard 642, pointing device 644 and game controller 646 may be omitted.

The computer system 600 further comprises a graphics processing unit (GPU) 650 coupled to the host bridge 614 by way of bus 652, such as a PCI Express (PCI-E) bus or Advanced Graphics Processing (AGP) bus. Other bus systems, including after-developed bus systems, may be equivalently used. Moreover, the graphics processing unit 650 may alternatively couple to the primary expansion bus 626, or one of the secondary expansion buses (e.g., PCI bus 632). The graphics processing unit 650 couples to a display system 654 which may comprise any suitable electronic display device or multiple distinct display devices, upon which any image or text can be displayed. The graphics processing unit 650 comprises an onboard processor 656, as well as onboard memory 658. The processor 656 may thus perform graphics processing, as commanded by the main processor 610. Moreover, the memory 658 may be significant, on the order of several hundred gigabytes or more. Thus, once commanded by the main processor 610, the graphics processing unit 650 may perform significant calculations regarding graphics to be displayed on the display system, and ultimately display such graphics, without further input or assistance of the main processor 610. In some case, such as the computer system 600 operated as server computer system, the graphics processing unit 650 and display system 654 may be omitted.

From the description provided herein, those skilled in the art are readily able to combine software created as described with appropriate general-purpose or special-purpose computer hardware to create a computer system and/or computer sub-components in accordance with the various embodiments, to create a computer system and/or computer sub-components for carrying out the methods of the various embodiments, and/or to create a non-transitory computer-readable storage medium (i.e., other than an signal traveling along a conductor or carrier wave) for storing a software program to implement the method aspects of the various embodiments.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method comprising:
receiving, by a computer system, a complex fracture model that estimates fractures in a subsurface target of a target field;
applying the complex fracture model to a reservoir model for estimating subsurface geological features between the subsurface target and earth's surface;
receiving a surface culture grid model representing surface features of the target field; and
determining a location for an earth surface well site and a well path from the earth surface well site to the subsurface target based on the complex fracture model, the surface culture grid model, and the estimated subsurface geological features, wherein the earth surface well site is offset from the subsurface target.

2. The method of claim 1, wherein the complex fracture model estimates orientation, dip, and spacing of fractures in the subsurface target.

3. The method of claim 1, wherein the complex fracture model estimates the fractures in the subsurface target based on microseismic data.

4. The method of claim 1 further comprising determining a fracture conductivity distribution based on the stress and fracability estimates.

5. The method of claim 1, wherein determining the location for the earth surface well site comprises determining a location of interfering surface features of the target field based on the surface culture grid model and avoiding said interfering surface features.

6. The method of claim 1 further comprising performing a stochastic flow simulation based on the fractures estimated by the complex fracture model.

7. The method of claim 1 further comprising determining a spacing between a plurality of earth surface well sites offset from the subsurface target based on the complex fracture model and the estimated subsurface geological features.

8. The method of claim 1 further comprising determining a spacing between fracture stages of the well path based on the complex fracture model and the estimated subsurface geological features.

9. A computer system comprising:
a processor;
a memory coupled to the processor,
wherein the memory stores a program that, when executed by the processor, causes the processor to:
determine a location for an earth surface well site and a well path from the earth surface well site to a subsurface target in a target field based on complex fracture estimates for the subsurface target, surface features of the target field that limit placement of the earth surface well site, and geological feature estimates between the subsurface target and earth's surface.

10. The computer system of claim 9, wherein the complex fracture estimates are based on microseismic data that identifies orientation, dip, and spacing of fractures in the subsurface target.

11. The computer system of claim 9, wherein the program further causes the processor to determine the location for the earth surface well site based on fracture conductivity distribution estimates.

12. The computer system of claim 9, wherein the program further causes the processor to determine the location for the earth surface well site based on a surface culture grid model representing natural and manmade features of the target field's surface that interfere with placement of the earth surface well site.

13. The computer system of claim 9, wherein the program further causes the processor to perform a stochastic flow simulation based on the complex fracture estimates.

14. The computer system of claim 9, wherein the program further causes the processor to determine a spacing between a plurality of earth surface well sites offset from the subsurface target based on the complex fracture estimates and the geological feature estimates.

15. The computer system of claim 9, wherein the program further causes the processor to determine a spacing between fracture stages of the well path based on the complex fracture estimates and the geological feature estimates.

16. A non-transitory computer-readable medium storing a program that, when executed by a processor, causes the processor to:
estimate complex fractures in a plurality of subsurface targets in a field;
estimate geological features between the plurality of subsurface targets and a surface of the field;
identify features of the surface that limit placement of earth surface well sites;
determine locations for a plurality of surface well sites based on the estimated complex fractures, the identified features of the surface, and the estimated geological features between the plurality of subsurface targets and the surface; and
determine a well plan for the field based on the estimated complex fractures and the estimated geological features, wherein the well plan comprises the locations of the plurality of surface well sites and corresponding well paths to the plurality of subsurface targets.

17. The non-transitory computer-readable medium of claim 16, wherein the program causes the processor to estimate orientation, dip, and spacing of fractures in the field based on microseismic data.

18. The non-transitory computer-readable medium of claim 16, wherein the program causes the processor to estimate a fracture conductivity distribution from the estimated complex fractures and to develop the well plan for the field based on the estimated fracture conductivity distribution.

19. The non-transitory computer-readable medium of claim 16, wherein the program causes the processor to estimate a stochastic flow simulation based on the estimated complex fractures and to develop the well plan for the field based on the estimated stochastic flow simulation.

20. The non-transitory computer-readable medium of claim 16, wherein the estimated geological features comprise at least one brittle region in the field and wherein the program causes the processor to determine the well plan for the field by directing at least one of the wells paths through the at least one brittle region.

* * * * *